United States Patent
Jimenez Martinez

(10) Patent No.: US 11,955,481 B2
(45) Date of Patent: Apr. 9, 2024

(54) DEVICE COMPRISING A PNP BIPOLAR TRANSISTOR AND NPN BIPOLAR TRANSISTOR FOR RADIOFREQUENCY APPLICATIONS

(71) Applicant: STMicroelectronics (Crolles 2) SAS, Crolles (FR)

(72) Inventor: Jean Jimenez Martinez, Salles d'Aude (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/992,602

(22) Filed: Nov. 22, 2022

(65) Prior Publication Data
US 2023/0090291 A1 Mar. 23, 2023

Related U.S. Application Data

(62) Division of application No. 17/160,598, filed on Jan. 28, 2021, now Pat. No. 11,538,719.

(30) Foreign Application Priority Data

Jan. 30, 2020 (FR) ...................................... 2000903

(51) Int. Cl.
*H01L 27/08* (2006.01)
*H01L 21/8228* (2006.01)
*H01L 27/082* (2006.01)

(52) U.S. Cl.
CPC .... *H01L 27/0826* (2013.01); *H01L 21/82285* (2013.01)

(58) Field of Classification Search
CPC ........... H01L 21/82285; H01L 27/0826; H01L 29/732; H01L 29/0821; H01L 29/66272;
(Continued)

(56) References Cited

U.S. PATENT DOCUMENTS 4,357,622 A * 11/1982 Magdo ................ H01L 29/0804
257/E21.151
4,939,099 A 7/1990 Seacrist et al.
(Continued)

FOREIGN PATENT DOCUMENTS

| EP | 1146561 A1 | 10/2001 |
|----|-----------|---------|
| FR | 2300417 A1 | 9/1976 |
| GB | 1533156 | 11/1978 |

OTHER PUBLICATIONS

INPI Search Report and Written Opinion for FR Appl. No. 2000903 dated Oct. 6, 2020 (8 pages).

*Primary Examiner* — Shouxiang Hu
(74) *Attorney, Agent, or Firm* — Crowe & Dunlevy LLC

(57) ABSTRACT

A microelectronic device includes a PNP transistor and NPN transistor arranged vertically in a P-type doped semiconductor substrate. The PNP and NPN transistors are manufactured by: forming an N+ doped isolating well for the PNP transistor in the semiconductor substrate; forming a P+ doped region in the N+ doped isolating well; epitaxially growing a first semiconductor layer on the semiconductor substrate; forming an N+ doped well for the NPN transistor, where at least part of the N+ doped well extends into the first semiconductor layer; then epitaxially growing a second semiconductor layer on the first semiconductor layer; forming a P doped region forming the collector of the PNP transistor in the second semiconductor layer and in electrical contact with the P+ doped region; and forming an N doped region forming the collector of the NPN transistor in the second semiconductor layer and in electrical contact with the N+ doped well.

24 Claims, 4 Drawing Sheets

(58) Field of Classification Search
CPC ............ H01L 21/8228; H01L 27/0821; H01L 29/0684
See application file for complete search history.

(56) References Cited

U.S. PATENT DOCUMENTS

| | | | | |
|---|---|---|---|---|
| 5,175,607 | A | * 12/1992 | Ikeda | ............... H01L 21/8222 257/E27.057 |
| 5,218,227 | A | 6/1993 | Sinoshita et al. | |
| 5,302,848 | A | 4/1994 | Lapham et al. | |
| 5,955,775 | A | * 9/1999 | Miwa | ............... H01L 21/82285 257/E21.612 |
| 6,815,801 | B2 | * 11/2004 | Romas | ............... H01L 21/8224 257/E21.612 |
| 2003/0146468 | A1 | 8/2003 | Gris et al. | |
| 2003/0183903 | A1 | 10/2003 | Ikeda | |

* cited by examiner

DEVICE COMPRISING A PNP BIPOLAR TRANSISTOR AND NPN BIPOLAR TRANSISTOR FOR RADIOFREQUENCY APPLICATIONS

CROSS REFERENCE TO RELATED APPLICATIONS

This application is a divisional from U.S. application patent Ser. No. 17/160,598, filed Jan. 28, 2021, which claims the priority benefit of French Application for Patent No. 2000903, filed on Jan. 30, 2020, the contents of which are hereby incorporated by reference in their entireties to the maximum extent allowable by law.

TECHNICAL FIELD

The present document relates to a method for fabricating a microelectronic device comprising at least two bipolar transistors including an NPN transistor and a vertical PNP transistor, and further relates to said microelectronic device. The applications of said microelectronic device particularly concern the field of radiofrequency.

BACKGROUND

The integration of bipolar transistors of PNP type in microelectronic devices of BiCMOS or bipolar technology, for radiofrequency (RF) applications, gives rise to difficulties.

If a microelectronic device comprises both PNP bipolar transistors and NPN bipolar transistors, it is not possible to optimize the performance of each of said transistors.

In said microelectronic devices, a PNP bipolar transistor and NPN bipolar transistor may be fabricated as follows.

A P-doped semiconductor substrate is provided.

Localized implanting of N dopants (e.g., phosphorus) followed by diffusion annealing of said N dopants are carried out for the forming in the semiconductor substrate of an N-well intended to be reverse polarized so that the collector of the PNP bipolar transistor may be electrically isolated from the substrate. Localized implanting of P dopants (e.g., boron) followed by diffusion annealing of said P dopants are carried out to form a P+ doped well within the N-well.

Also, localized implanting of N dopants (e.g. arsenic) followed by diffusion annealing of said N dopants are carried out for the forming in the semiconductor substrate of an N+-well intended to isolate the collector of the NPN bipolar transistor electrically from the semiconductor substrate.

A semiconductor layer is formed via epitaxy on the semiconductor substrate to a thickness of approximately 1 μm. The growth of said semiconductor layer on the semiconductor substrate allows burying of the P+ and N+ wells in the semiconductor substrate.

Localized implanting of P dopants followed by diffusion annealing of said P dopants are carried out to form a P-doped region in the epitaxial semiconductor layer, said region forming the collector of the PNP bipolar transistor in electrical contact with the P+-doped region.

Localized implanting of N dopants followed by diffusion annealing of said N dopants are carried out to form an N-doped region in the epitaxial semiconductor layer, said region forming the collector of the NPN bipolar transistor in electrical contact with the N+ doped region.

The base and emitter of each of the bipolar transistors are then formed on a respective collector of said transistors.

One disadvantage of said method is the difference in behavior in terms of diffusion of the implanted dopants to form the P+ and N+ wells. N-type dopants are heavy species such as arsenic and antimony. On the other hand, P-type dopants are light species such as boron. Having regard to their different coefficients of diffusion, N-type dopants scarcely diffuse within the substrate, whereas P-type dopants easily diffuse. As a result, the P+ well of the PNP bipolar transistor extends further via diffusion towards the surface of the substrate than the N+ well of the NPN bipolar transistor.

The epitaxial semiconductor layer must therefore be sufficiently thick, approximately 1 μm, to take into account this greater diffusion of the P+ well and to maintain sufficient thickness for the forming of the collector of the PNP transistor. However, the NPN bipolar transistor is penalized by said thickness of the epitaxial semiconductor layer. The performance thereof in terms of transistor speed is significantly reduced.

One alternative to reduce the thickness of the epitaxial semiconductor layer would be to bury the P+ well deeper within the substrate. However, this would necessitate the implanting of dopants with high energy which could generate crystalline defects in the substrate, which would penalize the performance of the PNP transistor.

There is accordingly a need in the art for the possibility to optimize the performance of a PNP bipolar transistor and NPN bipolar transistor independently of each other in a microelectronic device for ultra-high frequency applications.

SUMMARY

In an embodiment, a method is presented for fabricating a microelectronic device comprising a P-type doped semiconductor substrate and a PNP transistor and NPN transistor arranged vertically in said semiconductor substrate. The method comprises the following successive steps: forming an N+ doped isolating well of the PNP transistor in the semiconductor substrate; forming a P+ doped region in the N+ doped isolating well; epitaxially growing of a first semiconductor layer on the semiconductor substrate; forming an N+ doped well of the NPN transistor, at least part of said N+ doped well extending into the first semiconductor layer; epitaxially growing a second semiconductor layer on the first semiconductor layer; forming a P doped region configured to form the collector of the PNP transistor in the second semiconductor layer, in electrical contact with the P+ doped region; and forming an N doped region configured to form the collector of the NPN transistor in the second semiconductor layer, in electrical contact with the N+ doped well.

By "successive" it is meant that the steps take place in the indicated order, which does not exclude the performing of intermediate steps.

By "radiofrequency" (RF) it is meant herein an electromagnetic wave frequency in the range of 20 GHz to 300 GHz.

By means of the two semiconductor layers formed by epitaxial growth, the first of which is formed between the forming of the P+ well of the PNP transistor and the forming of the N+ well of the NPN transistor, and the second is formed between the forming of the N+ well and the forming of the collector of said transistors, it is possible to bury the P+ well deeper in the substrate than the N+ well without applying high-energy implantation.

On this account, the formation of crystalline defects is prevented in the region subjected to implanting.

In addition, a relatively thin thickness of the second epitaxial layer allows an increase in the speed of the NPN transistor without being penalized by the greater diffusion of the P+ well of the PNP transistor.

In other words, the two epitaxial layers allow de-linking between optimization of the NPN transistor and optimization of the PNP transistor.

In some embodiments, the first semiconductor layer has a thickness of between 0.5 and 0.7 μm.

Said first semiconductor layer may be lightly P doped or it may be non-intentionally doped.

In some embodiments the second semiconductor layer has a thickness of between 0.3 and 0.5 μm.

Said second semiconductor layer may be lightly N doped or it may be non-intentionally doped.

In some embodiments, the sum of the thicknesses of the first and second semiconductor layers is between 0.8 and 1.2 μm.

In an embodiment, a microelectronic device comprises: a semiconductor substrate and a PNP transistor and NPN transistor arranged vertically in said substrate, wherein: the collector of the PNP transistor is arranged on a P+ doped region of the semiconductor substrate; the collector of the NPN transistor is arranged on an N+ doped well of the semiconductor substrate; said P+ doped region of the PNP transistor extending at least partly into a first semiconductor layer and the N+ doped well of the NPN transistor extending at least partly into a second semiconductor layer arranged on the first semiconductor layer, the P+ doped region of the PNP transistor being further distant from the surface of the device than the N+ doped well of the NPN transistor.

In some embodiments, the first semiconductor layer has a thickness of between 0.5 and 0.7 μm.

Said first semiconductor layer may be lightly P doped or it may be non-intentionally doped.

In some embodiments, the second semiconductor layer has a thickness of between 0.3 and 0.5 μm.

Said second semiconductor layer may be lightly N doped or it may be non-intentionally doped.

In some embodiments, the sum of the thicknesses of the first and second semiconductor layers is between 0.8 and 1.2 μm.

BRIEF DESCRIPTION OF THE DRAWINGS

Other characteristics and advantages of these embodiments will become apparent in the following detailed description with reference to the appended drawings in which.

For reasons of legibility of the figures, they are not drawn to scale. Also, the drawings have been simplified so as only to show those elements that are useful for comprehension of the Figures.

DETAILED DESCRIPTION

The successive steps of the method for fabricating a microelectronic device comprising a P-type doped semiconductor substrate and a PNP transistor and NPN transistor arranged vertically in said semiconductor substrate are schematically illustrated in FIGS. 1 to 10.

Figure 1:
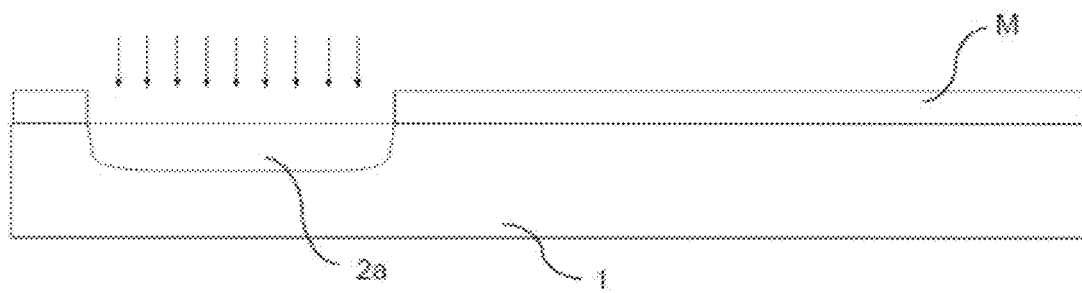
FIG. 1 is a schematic cross-sectional view of a P-type substrate at the time of localized implanting of N-type dopants.

With reference to FIG. 1, the semiconductor substrate 1 is a P-type doped semiconductor substrate. The material of the semiconductor substrate may be silicon, for example.

A mask M is formed on the main surface of the substrate 1. The mask M comprises at least one opening allowing exposure of a determined portion of the surface of the semiconductor substrate 1, corresponding to the site of a PNP transistor. The mask M may be formed with a photo-lithography technique conventionally used in methods to fabricate microelectronics.

Dopants are implanted (symbolized by the arrows) in the opening of the mask (the material and thickness of the mask M being selected to prevent any passing of dopants through the mask). The dopants are of N-type (e.g., phosphorus).

A region 2a containing the implanted dopants therefore extends into part of the thickness of the substrate 1, from the portion of surface exposed by the opening of the mask M.

Figure 2:
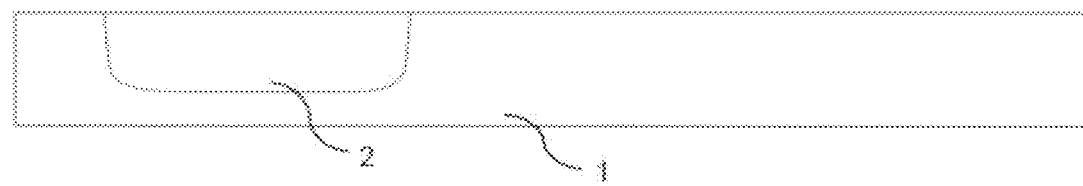
FIG. 2 is a schematic view of the substrate in FIG. 1 after diffusion annealing of the implanted dopants to form a region isolating the collector of a PNP transistor from the substrate.

With reference to FIG. 2, heat treatment is applied to the semiconductor substrate thus implanted and the mask M is removed.

Said heat treatment is applied under conditions allowing diffusion and activation of the dopants in region 2a to form an N+ doped well 2. As will be seen below, said N+ doped well 2 is intended to form the isolating well of the PNP transistor.

Figure 3:
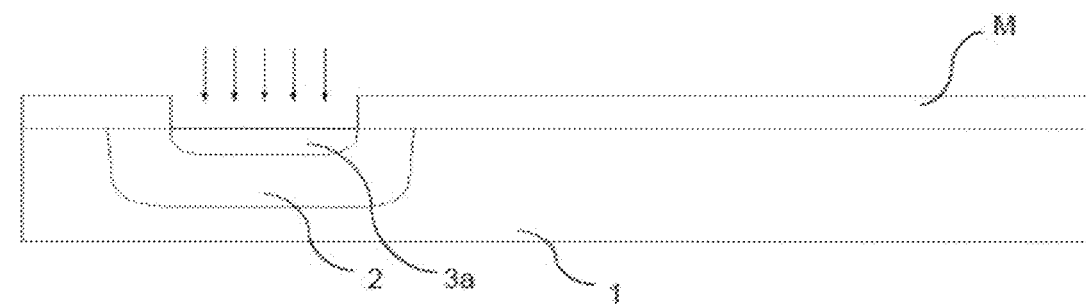
FIG. 3 is a schematic cross-sectional view of the substrate in FIG. 2 at the time of localized implanting of P-type dopants in the isolating region.

With reference to FIG. 3, a new mask M is formed on the main surface of semiconductor substrate 1. The mask M comprises at least one opening allowing exposure of a determined portion of the surface of the semiconductor substrate 1 opposite the well 2. Said opening is of smaller size than the well 2.

Dopants are implanted (schematized by the arrows) in the opening of the mask (the material and thickness of the mask M being selected to prevent any passing of dopants through the mask). The dopants are of P-type (e.g., boron).

A region 3a containing the implanted dopants therefore extends into part of the thickness of the well 2, from the portion of surface exposed by the opening of the mask M.

Figure 4:
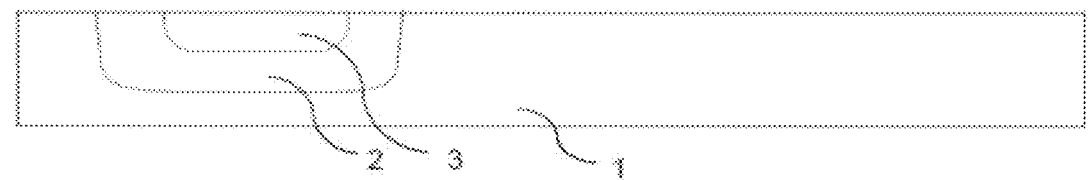
FIG. 4 is a schematic cross-sectional view of the substrate in FIG. 3 after diffusion annealing of the P-type dopants implanted to form the P+ well of the PNP transistor.

With reference to FIG. 4, heat treatment is applied to the semiconductor substrate thus implanted, and the mask M is removed.

Said heat treatment is applied under conditions allowing the diffusion and activation of the dopants in region 3a, to form a P+ doped region 3 in the well 2.

Figure 5:
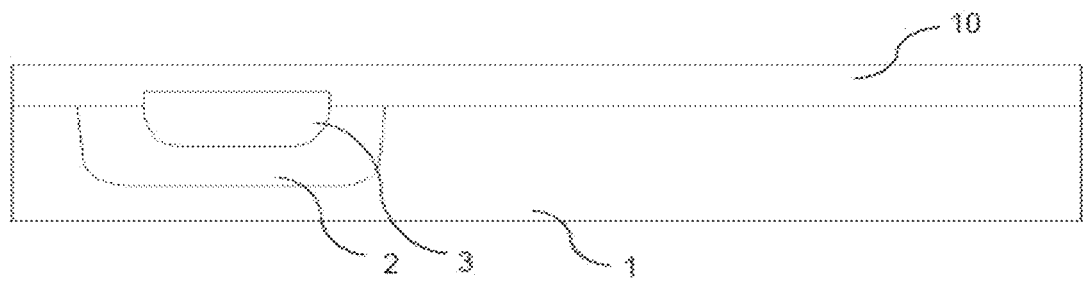
FIG. 5 is a schematic cross-sectional view of the substrate in FIG. 4 after forming a first epitaxial layer on the substrate.

With reference to FIG. 5, epitaxial growth of a first semiconductor layer 10 is performed on the main surface of substrate 1. Preferably, the material of the epitaxial layer is the same as that of the substrate 1 (homoepitaxy). Optionally, the material of the epitaxial layer may differ from that of the substrate 1 (heteroepitaxy) but with a lattice parameter as close as possible to that of the substrate 1 to minimize the formation of crystalline defects in the epitaxial layer.

The first epitaxial layer 10 may be lightly P doped, or non-intentionally doped.

One function of said first epitaxial layer 10 is to contribute towards burying the P+ doped region 3 within the structure.

The thickness of the first epitaxial layer 10 may be between 0.5 and 0.7 µm.

The dopants of the N+ doped region 3 may optionally diffuse into part of the first epitaxial layer 10 under the effect of the temperature of the epitaxy step.

Figure 6:
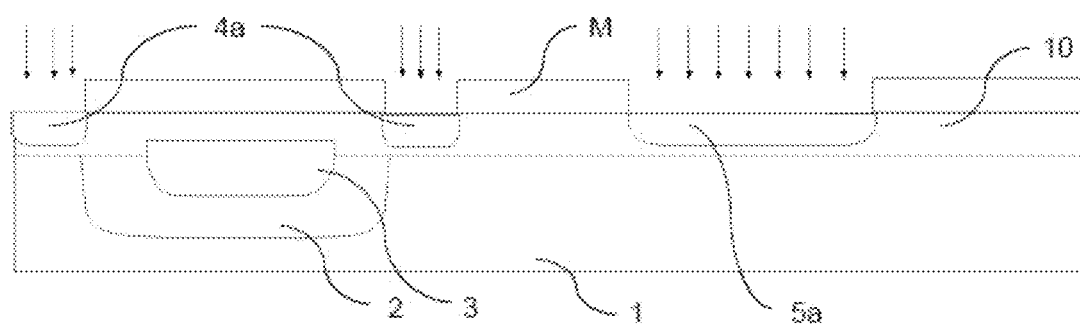
FIG. 6 is a schematic cross-sectional view of the substrate in FIG. 5 at the time of implanting N-type dopants.

With reference to FIG. 6, a new mask M is formed on the main surface of the first epitaxial layer 10. The mask M comprises openings allowing exposure of determined portions of the first epitaxial layer 10 on either side of the well 2 (on the left side in the Figure) and the site of an NPN transistor (on the right side in the Figure).

Implanting of dopants (schematized by the arrows) is performed in the opening of the mask (the material and thickness of the mask M being selected to prevent any passing of dopants through the mask). The dopants are of N-type (e.g., arsenic).

Regions 4a and 5a containing the implanted dopants therefore extend into part of the thickness of the first epitaxial layer 10, in the part dedicated to the forming of the PNP transistor (either side of well 2) and into the part dedicated to the forming of the NPN transistor respectively, from the portion of surface exposed by the opening of the mask M.

Figure 7:
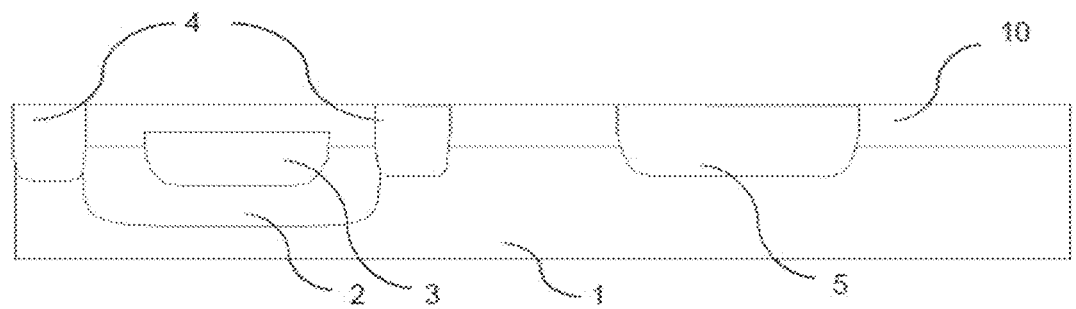
FIG. 7 is a schematic cross-sectional view of the substrate in FIG. 6 after diffusion annealing of the N-type dopants implanted to form an N+ well of an NPN transistor.

With reference to FIG. 7, heat treatment is applied to the semiconductor substrate thus implanted, and the mask M is removed.

Said heat treatment is applied under conditions allowing diffusion and activation of the dopants in regions 4a and 5a, to form N+ doped regions 4 and 5 in the first epitaxial layer 10 and part of the semiconductor substrate 1.

Regions 4 are intended to ensure electrical continuity between the well 2 and the surface of the device, so as to allow electrical polarization of the well 2 of the PNP transistor.

Region 5 is intended to form a well of the NPN transistor.

Figure 8:
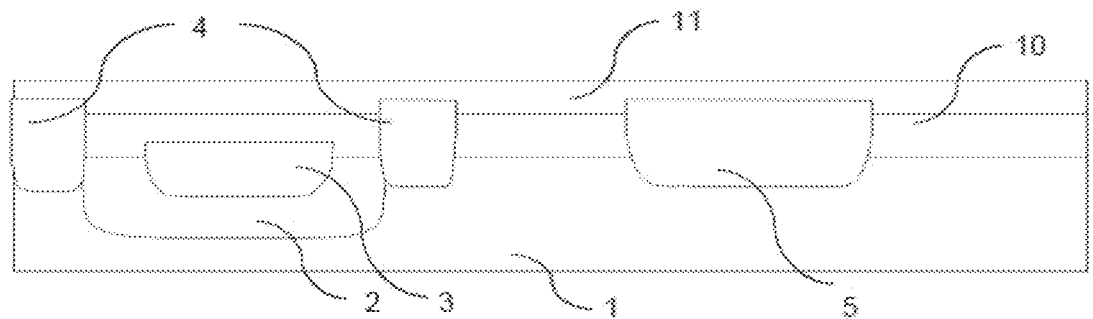
FIG. 8 is a schematic cross-sectional view of the substrate in FIG. 7 after forming a second epitaxial layer on the first epitaxial layer.

With reference to FIG. 8, epitaxial growth of a second semiconductor layer 11 is performed on the main surface of the first semiconductor layer 10. Preferably, the material of the second epitaxial layer is the same as that of the first epitaxial layer (homoepitaxy). Optionally, the material of the second epitaxial layer may differ from the material of the first epitaxial layer (heteroepitaxy) but with a lattice parameter as close as possible to that of the first epitaxial layer to minimize the formation of crystalline defects in the second epitaxial layer.

The dopants of the N+ doped well 5 may possibly diffuse into part of the second epitaxial layer 11 under the effect of the temperature of the epitaxy step.

The second epitaxial layer 11 may be lightly N-doped, or non-intentionally doped.

The thickness of the second epitaxial layer 11 may be between 0.3 and 0.5 µm.

One function of said second epitaxial layer 11 is to bury the N+ doped well 5 of the NPN transistor within the structure and, together with the previously formed first epitaxial layer 10, to contribute towards burying the P+ doped region 3 of the PNP transistor.

It can therefore be seen in FIG. 8 that the well 2 and region 3 of the PNP transistor are buried deeper in the structure than the well 5 of the NPN transistor, the well 2 and region 3 being separated from the surface of the structure in FIG. 8 by the stack of layers 10 and 11, which has a thickness of between 0.8 and 1.2 µm, whilst well 5 is separated from said surface solely by layer 11 which, as indicated above, has a thickness of between 0.3 and 0.5 µm.

The forming of the two epitaxial layers at different steps of the method therefore provides selectivity of implantation depth for the P+ doped region 3 of the PNP transistor and the N+ doped well 5 of the NPN transistor, while applying dopant implantation with moderate energy allowing minimization of implantation-related crystalline defects.

The thickness of the epitaxial layers 10 and 11 may be adjusted as a function of the heat budget to which the structure is subjected throughout fabrication of the device, to optimize the performance of the PNP transistor and NPN transistor. The thickness of the first epitaxial layer 10 may result from a compromise between the withstand voltage of the NPN transistor (which requires a sufficiently large thickness of layer 10) and the speed of the PNP transistor (which requires a sufficiently narrow thickness of layer 10). The thickness of the second epitaxial layer 11 may be chosen as a function of the desired withstand voltage of both transistors.

Figure 9:
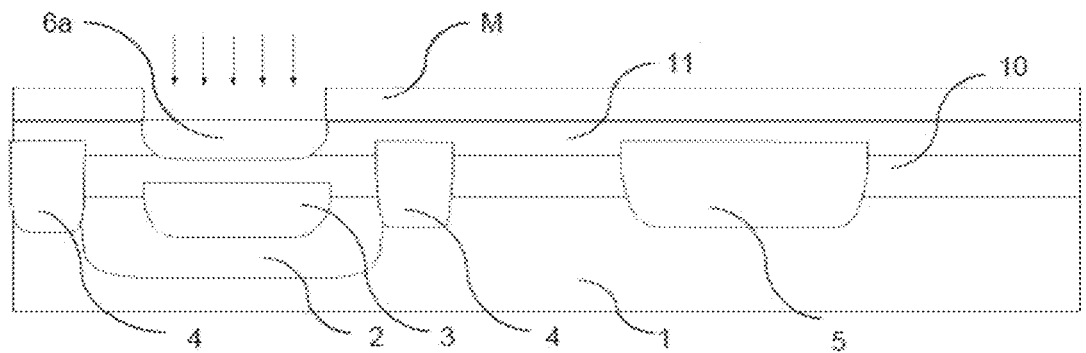
FIG. 9 is a schematic cross-sectional view of the substrate in FIG. 8 at the time of implanting P-type dopants in the second epitaxial layer.

With reference to FIG. 9, a new mask M is formed on the main surface of the second epitaxial layer 11. The mask M comprises at least one opening allowing exposure of a determined portion of the surface of the second epitaxial layer opposite region 3 of the PNP transistor.

Implanting of dopants (schematized by the arrows) is performed in the opening of the mask (the material and thickness of the mask M being selected to prevent any passing of dopants through the mask). The dopants are of P-type (e.g., boron).

A region 6a containing the implanted dopants therefore extends into the second epitaxial layer 11 and possibly into part of the first epitaxial layer 10, from the portion of surface exposed by the opening of the mask M.

Figure 10:
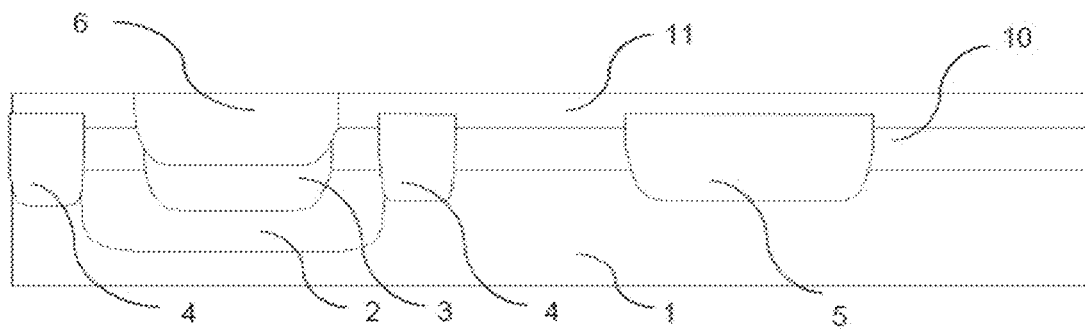
FIG. 10 is a schematic cross-sectional view of the substrate in FIG. 9 after diffusion annealing of the P-type dopants implanted to form the collector of the PNP transistor.

With reference to FIG. 10, heat treatment is applied to the structure thus implanted and the mask M is removed.

Said heat treatment is applied under conditions allowing the diffusion and activation of the dopants in region 6a, to form a P doped region 6 extending as far as the P+ doped region 3, to ensure electrical continuity with region 3. Region 6 is intended to form the collector of the PNP transistor.

Similarly (not schematized), a new mask is formed on the main surface of the second epitaxial layer. The mask comprises at least one opening allowing exposure of a determined portion of the surface of the second epitaxial layer opposite the well 5 of the NPN transistor.

Implanting of dopants is performed in the opening of the mask (the material and thickness of the mask M being selected to prevent any passing of dopants through the mask). The dopants are of N-type (e.g., arsenic).

A region containing the implanted dopants therefore extends into the second epitaxial layer and possibly into the well 5, from the portion of surface exposed by the opening of the mask M.

Heat treatment is then applied to the structure thus implanted and the mask is removed.

Said heat treatment is applied under conditions allowing diffusion and activation of the dopants in the doped region to form a region (referenced 7 in FIG. 11) that is N doped extending as far as the N+ doped well 5, to ensure electrical continuity with the well 5. Region 7 is intended to form the collector of the NPN transistor.

Figure 11:
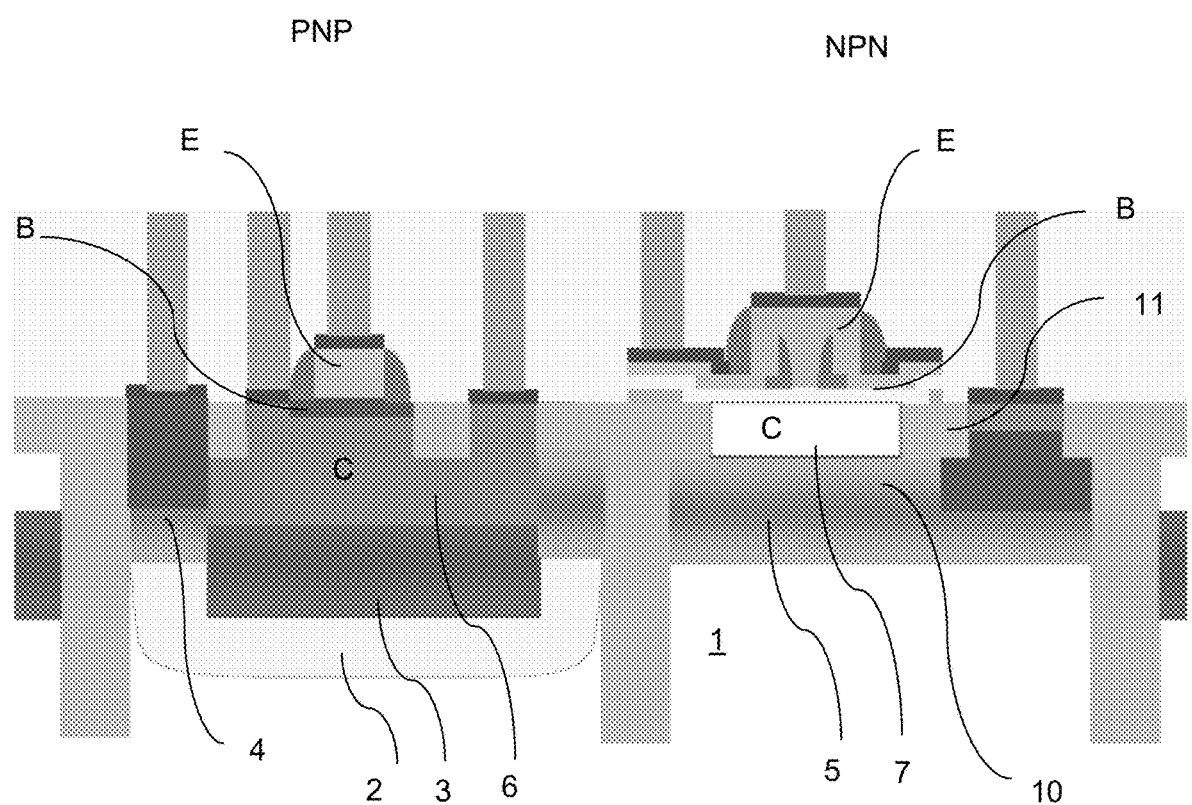
FIG. 11 is a schematic cross-sectional view of a device comprising a PNP transistor and NPN transistor obtained with the above-described method.

FIG. 11 is a cross-sectional view of the device after forming the emitter E and base B of the PNP transistor (on the left) and of the NPN transistor (on the right). The forming of these components is obtained with methods known per se and will therefore not be described herein.

As indicated above, the P+ doped region 3 of the PNP transistor is further distant from the surface of the device than the N+ doped well 5 of the NPN transistor.

This difference in depth arrangement of these regions/wells allows consideration to be given to the greater diffusion of the P dopants of the PNP transistor during the different heat treatments applied when fabricating the device, without penalizing the rapidity of the NPN transistor or requiring high-energy implantation which could generate crystalline defects. It therefore allows integration of these two types of transistors in one same semiconductor substrate of a microelectronic device without degrading the performance of either of these transistors.

The invention claimed is:

1. A microelectronic device including a PNP transistor and NPN transistor, comprising:
   a semiconductor substrate;
   a P+ doped region in the semiconductor substrate;
   a collector region for the PNP transistor arranged on the P+ doped region in the semiconductor substrate;
   an N+ doped well in the semiconductor substrate;
   a collector region for the NPN transistor arranged on the N+ doped well in the semiconductor substrate;
   a first epitaxial semiconductor layer;
   wherein said P+ doped region for the PNP transistor extends at least partly into the first epitaxial semiconductor layer; and
   a second epitaxial semiconductor layer arranged on the first epitaxial semiconductor layer;
   wherein the N+ doped well for the NPN transistor extends through the first epitaxial semiconductor layer and at least partly into the second epitaxial semiconductor layer; and
   wherein a portion of the P+ doped region for the PNP transistor is located farther from an upper device surface of the microelectronic device than any portion of the N+ doped well for the NPN transistor.

2. The device according to claim 1, wherein the first epitaxial semiconductor layer has a thickness of between 0.5 and 0.7 μm.

3. The device according to claim 1, wherein the first epitaxial semiconductor layer is lightly P-doped.

4. The device according to claim 1, wherein the first epitaxial semiconductor layer is non-intentionally doped.

5. The device according to claim 1, wherein the second epitaxial semiconductor layer has a thickness of between 0.3 and 0.5 μm.

6. The device according to claim 1, wherein the second epitaxial semiconductor layer is lightly N-doped.

7. The device according to claim 1, wherein the second epitaxial semiconductor layer is non-intentionally doped.

8. The device according to claim 1, wherein a sum of the thicknesses of the first and second epitaxial semiconductor layers is between 0.8 and 1.2 μm.

9. A microelectronic device that includes a PNP transistor and an NPN transistor, comprising:
   a semiconductor substrate that is P-type doped;
   an N+ doped isolating well for the PNP transistor in the semiconductor substrate;
   a first epitaxial semiconductor layer on the semiconductor substrate and extending over the N+ doped isolating well;
   a P+ doped region including a first portion in the N+ doped isolating well and a second portion in the first epitaxial semiconductor layer;
   an N+ doped well of the NPN transistor passing through the first epitaxial semiconductor layer and extending partially into the semiconductor substrate;
   a second epitaxial semiconductor layer on and in contact with both the first epitaxial semiconductor layer and the N+ doped well of the NPN transistor;
   a P doped region including a third portion in the second epitaxial semiconductor layer and a fourth portion in the first epitaxial semiconductor layer, wherein the P doped region provides a collector of the PNP transistor, and wherein said fourth portion of the P doped region is in electrical contact with the P+ doped region in the N+ doped isolating well;
   a base region for the PNP transistor in contact with the P doped region;
   an N doped region in the second epitaxial semiconductor layer that provides a collector of the NPN transistor, wherein the N doped region is in electrical contact with the N+ doped well; and
   a base region for the NPN transistor in contact with the N doped region.

10. The device according to claim 9, wherein the first epitaxial semiconductor layer has a thickness of between 0.5 and 0.7 μm.

11. The device according to claim 9, wherein the first epitaxial semiconductor layer is lightly P doped.

12. The device according to claim 9, wherein the first epitaxial semiconductor layer is non-intentionally doped.

13. The device according to claim 9, wherein the second epitaxial semiconductor layer has a thickness of between 0.3 and 0.5 μm.

14. The device according to claim 9, wherein the second epitaxial semiconductor layer is lightly N-doped.

15. The device according to claim 9, wherein the second epitaxial semiconductor layer is non-intentionally doped.

16. The device according to claim 9, wherein a sum of thicknesses of the first and second epitaxial semiconductor layers is between 0.8 and 1.2 μm.

17. A microelectronic device that includes a PNP transistor and an NPN transistor, comprising:
   a semiconductor substrate that is P-type doped;
   an N+ doped isolating well for the PNP transistor in the semiconductor substrate;
   a first epitaxial semiconductor layer extending on the N+ doped isolating well, and on the semiconductor substrate;
   a P+ doped region including a first portion in the N+ doped isolating well and a second portion in the first epitaxial semiconductor layer;

an N+ doped well of the NPN transistor at an upper surface of the first epitaxial semiconductor layer, wherein at least part of said N+ doped well extends from the upper surface and through the first epitaxial semiconductor layer to contact the semiconductor substrate;

a second epitaxial semiconductor layer extending on an upper surface of the N+ doped well and on the upper surface of the first epitaxial semiconductor layer;

a P doped region including a third portion in the second epitaxial semiconductor layer and a fourth portion in the first epitaxial semiconductor layer, wherein the P doped region forms a collector of the PNP transistor, and wherein said P doped region extends through the second epitaxial semiconductor layer and in the first epitaxial semiconductor layer to contact the P+ doped region;

a base region of the PNP transistor in contact with the P doped region;

an N doped region in the second epitaxial semiconductor layer that forms a collector of the NPN transistor, wherein at least a portion of the N doped region extends to contact the N+ doped well; and a base region of the NPN transistor in contact with the N doped region.

18. The device according to claim 17, wherein the first epitaxial semiconductor layer has a thickness of between 0.5 and 0.7 μm.

19. The device according to claim 17, wherein the first epitaxial semiconductor layer is lightly P doped.

20. The device according to claim 17, wherein the first epitaxial semiconductor layer is non-intentionally doped.

21. The device according to claim 17, wherein the second epitaxial semiconductor layer has a thickness of between 0.3 and 0.5 μm.

22. The device according to claim 17, wherein the second epitaxial semiconductor layer is lightly N-doped.

23. The device according to claim 17, wherein the second epitaxial semiconductor layer is non-intentionally doped.

24. The device according to claim 17, wherein a sum of thicknesses of the first and second epitaxial semiconductor layers is between 0.8 and 1.2 μm.

* * * * *